(12) United States Patent
Flemming

(10) Patent No.: US 11,270,843 B2
(45) Date of Patent: Mar. 8, 2022

(54) ANNULAR CAPACITOR RF, MICROWAVE AND MM WAVE SYSTEMS

(71) Applicant: 3D Glass Solutions, Inc., Albuquerque, NM (US)

(72) Inventor: Jeb H. Flemming, Albuquerque, NM (US)

(73) Assignee: 3D Glass Solutions, Inc., Albuquerque, NM (US)

( * ) Notice: Subject to any disclaimer, the term of this patent is extended or adjusted under 35 U.S.C. 154(b) by 0 days.

(21) Appl. No.: 17/259,887

(22) PCT Filed: Dec. 26, 2019

(86) PCT No.: PCT/US2019/068590
§ 371 (c)(1),
(2) Date: Jan. 12, 2021

(87) PCT Pub. No.: WO2020/139955
PCT Pub. Date: Jul. 2, 2020

(65) Prior Publication Data
US 2021/0225591 A1   Jul. 22, 2021

Related U.S. Application Data

(60) Provisional application No. 62/786,165, filed on Dec. 28, 2018.

(51) Int. Cl.
*H01G 4/012* (2006.01)
*H01G 4/33* (2006.01)
*H01G 4/40* (2006.01)

(52) U.S. Cl.
CPC .............. *H01G 4/012* (2013.01); *H01G 4/33* (2013.01); *H01G 4/40* (2013.01)

(58) Field of Classification Search
CPC . H01G 4/40; H01G 4/33; H01G 4/012; H01L 27/10861
(Continued)

(56) References Cited

U.S. PATENT DOCUMENTS 2,515,940 A   7/1950   Stookey
2,515,941 A   7/1950   Stookey
(Continued)

FOREIGN PATENT DOCUMENTS

CN   1562831 A    4/2004
CN   105938928    9/2016
(Continued)

OTHER PUBLICATIONS

European Search Report and Supplemental European Search Report for EP 18889385.3 dated Dec. 2, 2020, 8 pp.
(Continued)

*Primary Examiner* — Arun Ramaswamy
(74) *Attorney, Agent, or Firm* — Edwin S. Flores; Chalker Flores, LLP

(57) ABSTRACT

The present invention includes a method for creating an annular capacitor adjacent to via or imbedded metal structure allowing for device to be made in close proximity to the via connecting to a ground plane. The annular capacitor in close proximity to the metal filled via or imbedded metal structure allows the construction of capacitors, filters, or active devices enabling a smaller RF device and/or to shunt a signal to the integrated ground plane. This reduces the RF, Electronic noise and results in a reduced device size.

22 Claims, 7 Drawing Sheets

(58) Field of Classification Search
USPC .............. 361/302, 321.1, 328, 306.1, 301.4;
438/423, 243; 29/25.42; 174/262
See application file for complete search history.

(56) References Cited

U.S. PATENT DOCUMENTS

| | | |
|---|---|---|
| 2,628,160 A | 2/1953 | Stookey |
| 2,684,911 A | 7/1954 | Stookey |
| 2,971,853 A | 2/1961 | Stookey |
| 3,281,264 A | 10/1966 | Cape et al. |
| 3,904,991 A | 9/1975 | Ishli et al. |
| 3,985,531 A | 10/1976 | Grossman |
| 3,993,401 A | 11/1976 | Strehlow |
| 4,029,605 A | 6/1977 | Kosiorek |
| 4,131,516 A | 12/1978 | Bakos et al. |
| 4,413,061 A | 11/1983 | Kumar |
| 4,444,616 A | 4/1984 | Fujita et al. |
| 4,514,053 A | 4/1985 | Borelli et al. |
| 4,537,612 A | 8/1985 | Borelli et al. |
| 4,647,940 A | 3/1987 | Traut et al. |
| 4,692,015 A | 9/1987 | Loce et al. |
| 4,788,165 A | 11/1988 | Fong et al. |
| 4,942,076 A | 7/1990 | Panicker et al. |
| 5,078,771 A | 1/1992 | Wu |
| 5,147,740 A | 9/1992 | Robinson |
| 5,212,120 A | 5/1993 | Araujo et al. |
| 5,215,610 A | 6/1993 | Dipaolo et al. |
| 5,352,996 A | 10/1994 | Kawaguchi |
| 5,371,466 A | 12/1994 | Arakawa et al. |
| 5,374,291 A | 12/1994 | Yabe et al. |
| 5,395,498 A | 3/1995 | Gombinsky et al. |
| 5,409,741 A | 4/1995 | Laude |
| 5,733,370 A | 3/1998 | Chen et al. |
| 5,779,521 A | 7/1998 | Muroyama et al. |
| 5,850,623 A | 12/1998 | Carman, Jr. et al. |
| 5,902,715 A | 5/1999 | Tsukamoto et al. |
| 5,919,607 A | 7/1999 | Lawandy et al. |
| 5,998,224 A | 12/1999 | Rohr et al. |
| 6,066,448 A | 5/2000 | Wohlstadter et al. |
| 6,094,336 A | 7/2000 | Weekamp |
| 6,136,210 A | 10/2000 | Biegelsen et al. |
| 6,171,886 B1 | 1/2001 | Ghosh |
| 6,258,497 B1 | 7/2001 | Kropp et al. |
| 6,287,965 B1 | 9/2001 | Kang et al. |
| 6,329,702 B1 | 12/2001 | Gresham et al. |
| 6,373,369 B2 | 4/2002 | Huang et al. |
| 6,383,566 B1 | 5/2002 | Zagdoun |
| 6,485,690 B1 | 11/2002 | Pfost et al. |
| 6,495,411 B1 | 12/2002 | Mei |
| 6,511,793 B1 | 1/2003 | Cho et al. |
| 6,514,375 B2 | 2/2003 | Kijima |
| 6,562,523 B1 | 2/2003 | Wu et al. |
| 6,678,453 B2 | 1/2004 | Bellman et al. |
| 6,686,824 B1 | 2/2004 | Yamamoto et al. |
| 6,771,860 B2 | 8/2004 | Trezza et al. |
| 6,783,920 B2 | 8/2004 | Livingston et al. |
| 6,824,974 B2 | 11/2004 | Pisharody et al. |
| 6,843,902 B1 | 1/2005 | Penner et al. |
| 6,875,544 B1 | 4/2005 | Sweatt et al. |
| 6,932,933 B2 | 8/2005 | Halvajian et al. |
| 6,977,722 B2 | 12/2005 | Wohlstadter et al. |
| 7,033,821 B2 | 4/2006 | Kim et al. |
| 7,132,054 B1 | 11/2006 | Kravitz et al. |
| 7,179,638 B2 | 2/2007 | Anderson |
| 7,277,151 B2 | 10/2007 | Ryu et al. |
| 7,306,689 B2 | 12/2007 | Okubora et al. |
| 7,326,538 B2 | 2/2008 | Pitner et al. |
| 7,407,768 B2 | 8/2008 | Yamazaki et al. |
| 7,410,763 B2 | 8/2008 | Su et al. |
| 7,439,128 B2 | 10/2008 | Divakaruni |
| 7,470,518 B2 | 12/2008 | Chiu et al. |
| 7,497,554 B2 | 3/2009 | Okuno |
| 7,603,772 B2 | 10/2009 | Farnsworth et al. |
| 7,948,342 B2 | 5/2011 | Long |
| 8,062,753 B2 | 11/2011 | Schreder et al. |
| 8,076,162 B2 | 12/2011 | Flemming et al. |
| 8,096,147 B2 | 1/2012 | Flemming et al. |
| 8,361,333 B2 | 1/2013 | Flemming et al. |
| 8,492,315 B2 | 7/2013 | Flemming et al. |
| 8,709,702 B2 | 4/2014 | Flemming et al. |
| 9,385,083 B1 | 7/2016 | Herrault et al. |
| 9,449,753 B2 | 9/2016 | Kim |
| 9,635,757 B1 | 4/2017 | Chen et al. |
| 9,755,305 B2 | 9/2017 | Desclos et al. |
| 9,819,991 B1 | 11/2017 | Rajagopalan et al. |
| 10,070,533 B2 | 9/2018 | Flemming et al. |
| 10,201,901 B2 | 2/2019 | Flemming et al. |
| 2001/0051584 A1 | 12/2001 | Harada et al. |
| 2002/0015546 A1 | 2/2002 | Bhagavatula |
| 2002/0086246 A1 | 7/2002 | Lee |
| 2002/0100608 A1 | 8/2002 | Fushie et al. |
| 2003/0025227 A1 | 2/2003 | Daniell |
| 2003/0124716 A1 | 7/2003 | Hess et al. |
| 2003/0135201 A1 | 7/2003 | Gonnelli |
| 2003/0156819 A1 | 8/2003 | Pruss et al. |
| 2003/0174944 A1 | 9/2003 | Dannoux |
| 2003/0228682 A1 | 12/2003 | Lakowicz et al. |
| 2003/0231830 A1 | 12/2003 | Hikichi |
| 2004/0008391 A1 | 1/2004 | Bowley et al. |
| 2004/0020690 A1 | 2/2004 | Parker et al. |
| 2004/0155748 A1 | 8/2004 | Steingroever |
| 2004/0171076 A1 | 9/2004 | Dejneka et al. |
| 2004/0184705 A1 | 9/2004 | Shimada et al. |
| 2004/0198582 A1 | 10/2004 | Borrelli et al. |
| 2004/0227596 A1 | 11/2004 | Nguyen et al. |
| 2005/0089901 A1 | 4/2005 | Porter et al. |
| 2005/0105860 A1 | 5/2005 | Oono |
| 2005/0150683 A1 | 7/2005 | Farnworth et al. |
| 2005/0170670 A1 | 8/2005 | King et al. |
| 2005/0212432 A1 | 9/2005 | Neil et al. |
| 2005/0277550 A1 | 12/2005 | Brown et al. |
| 2006/0092079 A1 | 5/2006 | Rochemont |
| 2006/0118965 A1 | 6/2006 | Matsui |
| 2006/0147344 A1 | 7/2006 | Ahn et al. |
| 2006/0158300 A1 | 7/2006 | Korony et al. |
| 2006/0159916 A1 | 7/2006 | Dubrow et al. |
| 2006/0171033 A1 | 8/2006 | Shreder et al. |
| 2006/0177855 A1 | 8/2006 | Utermohlen et al. |
| 2006/0188907 A1 | 8/2006 | Lee et al. |
| 2006/0193214 A1 | 8/2006 | Shimano et al. |
| 2006/0283948 A1 | 12/2006 | Naito |
| 2007/0120263 A1 | 5/2007 | Gabric et al. |
| 2007/0121263 A1 | 5/2007 | Liu et al. |
| 2007/0155021 A1 | 7/2007 | Zhang et al. |
| 2007/0158787 A1 | 7/2007 | Chanchani |
| 2007/0248126 A1 | 10/2007 | Liu et al. |
| 2007/0267708 A1 | 11/2007 | Courcimault |
| 2007/0272829 A1 | 11/2007 | Nakagawa et al. |
| 2007/0279837 A1 | 12/2007 | Chow et al. |
| 2007/0296520 A1 | 12/2007 | Hosokawa et al. |
| 2008/0136572 A1 | 6/2008 | Ayasi et al. |
| 2008/0174976 A1 | 7/2008 | Satoh et al. |
| 2008/0182079 A1 | 7/2008 | Mirkin et al. |
| 2008/0223603 A1 | 9/2008 | Kim et al. |
| 2008/0226228 A1 | 9/2008 | Tamura |
| 2008/0245109 A1 | 10/2008 | Flemming et al. |
| 2008/0291442 A1 | 11/2008 | Lawandy |
| 2008/0305268 A1 | 12/2008 | Norman et al. |
| 2008/0316678 A1 | 12/2008 | Ehrenberg et al. |
| 2009/0029185 A1 | 1/2009 | Lee et al. |
| 2009/0075478 A1 | 3/2009 | Matsui |
| 2009/0130736 A1 | 5/2009 | Collis et al. |
| 2009/0170032 A1 | 7/2009 | Takahashi et al. |
| 2009/0182720 A1 | 7/2009 | Cain et al. |
| 2009/0243783 A1 | 10/2009 | Fouquet et al. |
| 2010/0022416 A1 | 1/2010 | Flemming et al. |
| 2010/0059265 A1 | 3/2010 | Myung-Soo |
| 2010/0237462 A1 | 9/2010 | Beker et al. |
| 2011/0003422 A1 | 1/2011 | Katragadda et al. |
| 2011/0045284 A1 | 2/2011 | Matsukawa et al. |
| 2011/0065662 A1 | 3/2011 | Rinsch et al. |
| 2011/0108525 A1 | 5/2011 | Chien et al. |
| 2011/0170273 A1 | 7/2011 | Helvajian |
| 2011/0195360 A1 | 8/2011 | Flemming et al. |

(56) References Cited

U.S. PATENT DOCUMENTS

| | | |
|---|---|---|
| 2011/0217657 A1 | 9/2011 | Flemming et al. |
| 2011/0284725 A1 | 11/2011 | Goldberg |
| 2011/0304999 A1 | 12/2011 | Yu et al. |
| 2012/0080612 A1 | 4/2012 | Grego |
| 2012/0161330 A1 | 6/2012 | Hlad et al. |
| 2013/0119401 A1 | 5/2013 | D'Evelyn et al. |
| 2013/0142998 A1 | 6/2013 | Flemming et al. |
| 2013/0183805 A1 | 7/2013 | Wong et al. |
| 2013/0209026 A1 | 8/2013 | Doany et al. |
| 2013/0233202 A1 | 9/2013 | Cao et al. |
| 2013/0278568 A1 | 10/2013 | Lasiter et al. |
| 2013/0308906 A1 | 11/2013 | Zheng et al. |
| 2013/0337604 A1 | 12/2013 | Ozawa et al. |
| 2014/0002906 A1 | 1/2014 | Shibuya |
| 2014/0035540 A1 | 2/2014 | Ehrenberg |
| 2014/0035892 A1 | 2/2014 | Shenoy |
| 2014/0035935 A1 | 2/2014 | Shenoy et al. |
| 2014/0070380 A1 | 3/2014 | Chiu et al. |
| 2014/0104284 A1 | 4/2014 | Shenoy et al. |
| 2014/0144681 A1 | 5/2014 | Pushparaj et al. |
| 2014/0145326 A1 | 5/2014 | Lin et al. |
| 2014/0169746 A1 | 6/2014 | Hung et al. |
| 2014/0203891 A1 | 7/2014 | Yazaki |
| 2014/0247269 A1 | 9/2014 | Berdy et al. |
| 2014/0272688 A1 | 9/2014 | Dillion |
| 2014/0367695 A1 | 12/2014 | Barlow |
| 2015/0048901 A1 | 2/2015 | Rogers |
| 2015/0210074 A1 | 7/2015 | Chen et al. |
| 2015/0263429 A1 | 9/2015 | Vahidpour et al. |
| 2015/0277047 A1 | 10/2015 | Flemming et al. |
| 2016/0048079 A1 | 2/2016 | Lee et al. |
| 2016/0181211 A1 | 6/2016 | Kamgaing et al. |
| 2016/0185653 A1 | 6/2016 | Fushie |
| 2016/0254579 A1 | 9/2016 | Mills |
| 2016/0265974 A1 | 9/2016 | Erte et al. |
| 2016/0268665 A1 | 9/2016 | Sherrer et al. |
| 2016/0320568 A1 | 11/2016 | Haase |
| 2016/0380614 A1 | 12/2016 | Abbott et al. |
| 2017/0003421 A1 | 1/2017 | Flemming et al. |
| 2017/0077892 A1 | 3/2017 | Thorup |
| 2017/0094794 A1 | 3/2017 | Flemming et al. |
| 2017/0098501 A1 | 4/2017 | Flemming et al. |
| 2017/0213762 A1 | 7/2017 | Gouk |
| 2018/0323485 A1 | 11/2018 | Gnanou et al. |
| 2019/0280079 A1 | 7/2019 | Bouvier et al. |
| 2020/0275558 A1 | 8/2020 | Fujita |

FOREIGN PATENT DOCUMENTS

| | | |
|---|---|---|
| CN | 210668058 U | 6/2020 |
| DE | 102004059252 A1 | 1/2006 |
| EP | 0311274 A1 | 12/1989 |
| EP | 0507719 A1 | 10/1992 |
| EP | 0685857 B1 | 12/1995 |
| EP | 0949648 A1 | 10/1999 |
| EP | 1683571 A1 | 6/2006 |
| JP | 08179155 | 6/1905 |
| JP | 56-15587 | 12/1981 |
| JP | 61149905 | 7/1986 |
| JP | 61231529 A | 10/1986 |
| JP | 62202840 A | 9/1987 |
| JP | 63-128699 A | 6/1988 |
| JP | 08026767 A | 6/1988 |
| JP | H393683 A | 4/1991 |
| JP | 05139787 A | 6/1993 |
| JP | 10007435 A | 1/1998 |
| JP | 10199728 A | 7/1998 |
| JP | 11344648 A | 12/1999 |
| JP | 2000228615 A | 8/2000 |
| JP | 2001033664 A | 2/2001 |
| JP | 2001206735 A | 7/2001 |
| JP | 2005302987 A | 10/2005 |
| JP | 2005215644 A | 11/2005 |
| JP | 2006179564 A | 6/2006 |
| JP | 2008252797 A | 10/2008 |
| JP | 2012079960 A | 4/2012 |
| JP | 2013062473 A | 4/2013 |
| JP | 2013217989 A | 10/2013 |
| JP | 2014241365 A | 12/2014 |
| JP | 2015028651 A | 2/2015 |
| JP | H08026767 A | 1/2016 |
| JP | 2018200912 A | 12/2018 |
| KR | 100941691 B1 | 2/2010 |
| KR | 101167691 B1 | 7/2012 |
| WO | 2007088058 A1 | 8/2007 |
| WO | 2008119080 A1 | 10/2008 |
| WO | 2008154931 A1 | 12/2008 |
| WO | 2009029733 A2 | 3/2009 |
| WO | 2009062011 A1 | 5/2009 |
| WO | 2009126649 A2 | 10/2009 |
| WO | 2010011939 A2 | 1/2010 |
| WO | 2011100445 A1 | 8/2011 |
| WO | 2011109648 A1 | 9/2011 |
| WO | 2012078213 A1 | 6/2012 |
| WO | 2014062226 A1 | 1/2014 |
| WO | 2014043267 A1 | 3/2014 |
| WO | 2014062311 A1 | 4/2014 |
| WO | 2015108648 A1 | 7/2015 |
| WO | 2015112903 A1 | 7/2015 |
| WO | 2015171597 A1 | 11/2015 |
| WO | 2017132280 A2 | 8/2017 |
| WO | 2017147511 A1 | 8/2017 |
| WO | 2017177171 A1 | 10/2017 |
| WO | 2018200804 A1 | 1/2018 |
| WO | 2019010045 A1 | 1/2019 |
| WO | 2019118761 A1 | 6/2019 |
| WO | 2019136024 A1 | 7/2019 |
| WO | 2019199470 A1 | 10/2019 |
| WO | 2019231947 A1 | 12/2019 |
| WO | 2020060824 A1 | 3/2020 |
| WO | 2020139951 A1 | 7/2020 |
| WO | 2020139955 A1 | 7/2020 |

OTHER PUBLICATIONS

European Search Report and Supplemental European Search Report for EP 18898912.3 dated Feb. 2, 2021, 10 pp.

Green, S., "Heterogeneous Integration of DARPA: Pathfinding and Progress in Assembly Approaches," viewed on and retrieved from the Internet on Feb. 26, 2021, <URL:https://web.archive.org/web/20181008153224/https://www.ectc.net/files/68/Demmin%20Darpa.pdf>, published Oct. 8, 2018 per the Wayback Machine.

International Search Report and Written Opinion for PCT/US2020/54394 dated Jan. 7, 2021 by the USPTO, 15 pp.

Aslan, et al., "Metal-Enhanced Fluorescence: an emerging tool in biotechnology" Current opinion in Biotechnology (2005), 16:55-62.

Azad, I., et al., "Design and Performance Analysis of 2.45 GHz Microwave Bandpass Filter with Reduced Harmonics," International Journal of Engineering Research and Development (2013), 5(11):57-67.

Bakir, Muhannad S., et al., "Revolutionary Nanosilicon Ancillary Technologies for Ultimate-Performance Gigascale Systems," IEEE 2007 Custom Integrated Circuits Conference (CICC), 2007, pp. 421-428.

Beke, S., et al., "Fabrication of Transparent and Conductive Microdevices," Journal of Laser Micro/Nanoengineering (2012), 7(1):28-32.

Brusberg, et al. "Thin Glass Based Packaging Technologies for Optoelectronic Modules" Electronic Components and Technology Conference, May 26-29, 2009, pp. 207-212, DOI:10.1109/ECTC.2009.5074018, pp. 208-211; Figures 3, 8.

Cheng, et al. "Three-dimensional Femtosecond Laser Integration in Glasses" The Review of Laser Engineering, vol. 36, 2008, pp. 1206-1209, Section 2, Subsection 3.1.

Chowdhury, et al, "Metal-Enhanced Chemiluminescence", J Fluorescence (2006), 16:295-299.

Drawford, Gregory P., "Flexible Flat Panel Display Technology," John Wiley and Sons, NY, (2005), 9 pages.

International Search Report and Written Opinion for PCT/US2021/21371 dated May 20, 2021 by the USPTO, 10 pp.

(56) References Cited

OTHER PUBLICATIONS

Dang, et al. "Integrated thermal-fluidic I/O interconnects for an on-chip microchannel heat sink," IEEE Electron Device Letters, vol. 27, No. 2, pp. 117-119, 2006.
Dietrich, T.R., et al., "Fabrication Technologies for Microsystems Utilizing Photoetchable Glass," Microelectronic Engineering 30, (1996), pp. 407-504.
Extended European Search Report 15741032.5 dated Aug. 4, 2017, 11 pp.
Extended European Search Report 15789595.4 dated Mar. 31, 2017, 7 pp.
Extended European Search Report 17744848.7 dated Oct. 30, 2019, 9 pp.
Extended European Search Report 17757365.6 dated Oct. 14, 2019, 14 pp.
Geddes, et al., "Metal-Enhanced Fluorescence" J Fluorescence, (2002), 12:121-129.
Gomez-Morilla, et al. "Micropatterning of Foturan photosensitive glass following exposure to MeV proton beams" Journal of Micromechanics and Microengineering, vol. 15, 2005, pp. 706-709, DOI:10.1088/0960-1317/15/4/006.
Intel Corporation, "Intel® 82566 Layout Checklist (version 1.0)", 2006.
International Search Report and Written Opinion for PCT/US2008/058783 dated Jul. 1, 2008, 15 pp.
International Search Report and Written Opinion for PCT/US2008/074699 dated Feb. 26, 2009, 11 pp.
International Search Report and Written Opinion for PCT/US2009/039807 dated Nov. 24, 2009, 13 pp.
International Search Report and Written Opinion for PCT/US2009/051711 dated Mar. 5, 2010, 15 pp.
International Search Report and Written Opinion for PCT/US2011/024369 dated Mar. 25, 2011, 13 pp.
International Search Report and Written Opinion for PCT/US2013/059305 dated Jan. 10, 2014, 6 pp.
International Search Report and Written Opinion for PCT/US2015/012758 dated Apr. 8, 2015, 11 pp.
International Search Report and Written Opinion for PCT/US2015/029222 dated Jul. 22, 2015, 9 pp.
International Search Report and Written Opinion for PCT/US2017/019483 dated May 19, 2017, 11 pp.
International Search Report and Written Opinion for PCT/US2017/026662 dated Jun. 5, 2017, 11 pp.
International Search Report and Written Opinion for PCT/US2018/029559 dated Aug. 3, 2018, 9 pp.
International Search Report and Written Opinion for PCT/US2018/039841 dated Sep. 20, 2018 by Australian Patent Office, 12 pp.
International Search Report and Written Opinion for PCT/US2018/065520 dated Mar. 20, 2019 by Australian Patent Office, 11 pp.
International Search Report and Written Opinion for PCT/US2018/068184 dated Mar. 19, 2019 by Australian Patent Office, 11 pp.
International Search Report and Written Opinion for PCT/US2019/024496 dated Jun. 20, 2019 by Australian Patent Office, 9 pp.
International Search Report and Written Opinion for PCT/US2019/34245 dated Aug. 9, 2019 by Australian Patent Office, 10 pp.
International Search Report and Written Opinion for PCT/US2019/50644 dated Dec. 4, 2019 by USPTO, 9 pp.
International Technology Roadmap for Semiconductors, 2007 Edition, "Assembly and Packaging," 9 pages.
Kamagaing, et al., "Investigation of a photodefinable glass substrate for millimeter-wave radios on package," Proceeds of the 2014 IEEE 64th Electronic Components and Technology Conference, May 27, 2014, pp. 1610-1615.
Lakowicz, et al.; "Advances in Surface-Enhanced Fluorescence", J Fluorescence, (2004), 14:425-441.
Lewis, SR., "Hawley's Condensed Chemical Dictionary." 13th ed, 1997, John Wiley and Sons. p. 231.

Lin, C.H., et al., "Fabrication of Microlens Arrays in Photosensitive Glass by Femtosecond Laser Direct Writing," Appl Phys A (2009) 97:751-757.
Livingston, F.E., et al., "Effect of Laser Parameters on the Exposure and Selective Etch Rate in Photostructurable Glass," SPIE vol. 4637 (2002); pp. 404-412.
Lyon, L.A., et al., "Raman Spectroscopy," Anal Chem (1998), 70:341R-361R.
Papapolymerou, I., et al., "Micromachined patch antennas," IEEE Transactions on Antennas and Propagation, vol. 46, No. 2, 1998, pp. 275-283.
Perro, A., et al., "Design and synthesis of Janus micro- and nanoparticles," J Mater Chem (2005), 15:3745-3760.
Quantum Leap, "Liquid Crystal Polymer (LCP) LDMOS Packages," Quantum Leap Datasheet, (2004), mlconnelly.com/QLPKG.Final_LDMOS_DataSheet.pdf, 2 pages.
Scrantom, Charles Q., "LTCC Technology—Where We Are and Where We're Going—IV," Jun. 2000, 12 pages.
TechNote #104, Bangs Laboratories, www.bangslabs.com/technotes/104.pdf, "Silica Microspheres".
TechNote #201, Bangs Laboratories, www.bangslabs.com/technotes/201.pdf, "Working with Microspheres".
TechNote #205, Bangs Laboratories, www.bangslabs.com/technotes/205.pdf, "Covalent Coupling".
Wang, et al. "Optical waveguide fabrication and integration with a micro-mirror inside photosensitive glass by femtosecond laser direct writing" Applied Physics A, vol. 88, 2007, pp. 699-704, DOI:10.1007/S00339-007-4030-9.
Zhang, H., et al., "Biofunctionalized Nanoarrays of Inorganic Structures Prepared by Dip-Pen Nanolithography," Nanotechnology (2003), 14:1113-1117.
Zhang, H., et al., Synthesis of Hierarchically Porous Silica and Metal Oxide Beads Using Emulsion-Templated Polymer Scaffolds, Chem Mater (2004), 16:4245-4256.
Chou, et al., "Design and Demonstration of Micro-mirrors and Lenses for Low Loss and Low Cost Single-Mode Fiber Coupling in 3D Glass Photonic Interposers," 2016 IEEE 66th Electronic Components and Technology Conference, May 31-Jun. 3, 7 pp.
European Search Report and Supplemental European Search Report for EP 18828907 dated Mar. 25, 2020, 11 pp.
International Search Report and Written Opinion for PCT/US2019/068586 dated Mar. 12, 2020 by USPTO, 10 pp.
International Search Report and Written Opinion for PCT/US2019/068590 dated Mar. 5, 2020 by USPTO, 9 pp.
International Search Report and Written Opinion for PCT/US2019/068593 dated Mar. 16, 2020 by USPTO, 8 pp.
Topper, et al., "Development of a high density glass interposer based on wafer level packaging technologies," 2014 IEEE 64th Electronic Components and Technology Conference, May 27, 2014, pp. 1498-1503.
Grine, F. et al., "High-Q Substrate Integrated Waveguide Resonator Filter With Dielectric Loading," IEEE Access vol. 5, Jul. 12, 2017, pp. 12526-12532.
Hyeon, I-J, et al., "Millimeter-Wave Substrate Integrated Waveguide Using Micromachined Tungsten-Coated Through Glass Silicon Via Structures," Micromachines, vol. 9, 172 Apr. 9, 2018, 9 pp.
International Search Report and Written Opinion for PCT/US2020/026673 dated Jun. 22, 2020, by the USPTO, 13 pp.
International Search Report and Written Opinion for PCT/US2020/28474 dated Jul. 17, 2020 by the USPTO, 7 pp.
Mohamedelhassan, A., "Fabrication of Ridge Waveguides in Lithium Niobate," Independent thesis Advanced level, KTH, School of Engineering Sciences, Physics, 2012, 68 pp.
Muharram, B., Thesis from University of Calgary Graduate Studies, "Substrate-Integrated Waveguide Based Antenna in Remote Respiratory Sensing," 2012, 97 pp.
European Search Report and Supplemental European Search Report for EP 19784673.6 dated Feb. 2, 2021, 8 pp.
European Search Report and Supplemental European Search Report for EP 19811031.4 dated Feb. 26, 2021, 7 pp.
International Search Report and Written Opinion for PCT/US2021/27499 dated Jun. 16, 2021 by the USPTO, 7 pp.

STEP 12. REMOVE THE PHOTORESIST TO FORM A TOP ELECTRODE FOR THE CAPACITOR STRUCTURE, WHICH IS DEPICTED IN FIG. 4E, WHICH SHOWS THE DEVICE 10, THAT NOW INCLUDES TOP METAL LAYER 22, DISPOSED ON THE INSULATOR 20, AND INCLUDES THE GAP 26, THE BOTTOM METAL LAYER 16, THE THROUGH-HOLE VIA 18, AND THE FIRST METAL LAYER 16.

STEP 13. COAT THE FRONT SIDE OF THE SUBSTRATE WITH A PHOTORESIST AND EXPOSE AND DEVELOP A CONNECTING METAL LINE TO BOTH SIDES OF THE BOTTOM METAL OF THE ANNULAR STRUCTURE.

STEP 14. USING A DC SPUTTERING SYSTEM, COAT THE PHOTORESIST WITH A COPPER ADHESION LAYER OF A FEW HUNDRED ANGSTROMS OF TANTALUM. COAT THE SUBSTRATE WITH 2 µM OF COPPER TO FORM THE TOP ELECTRODE. FIG. 4F SHOWS THE DEVICE 10, WHICH NOW INCLUDES ALL THE LAYERS AND PORTS 12 AND 14.

ANNULAR CAPACITOR RF, MICROWAVE AND MM WAVE SYSTEMS

CROSS-REFERENCE TO RELATED APPLICATIONS

This application is the National Stage of International Application No. PCT/US2019/068590, filed on 26 Dec. 2019 claiming the priority to U.S. Provisional Application No. 62/786,165 filed on 28 Dec. 2018, the contents of each of which are incorporated by reference herein.

STATEMENT OF FEDERALLY FUNDED RESEARCH

None.

TECHNICAL FIELD OF THE INVENTION

The present invention relates in general to the field of creating a planar surface between via(s) and other structures and the substrate used for RF microwave and millimeter wave applications reducing device/system size and lowering parasitic noise and signals.

SUMMARY OF THE INVENTION

Without limiting the scope of the invention, its background is described in connection with creating a planar surface between vias and other structures and the substrate used for RF, microwave, and millimeter wave applications. The fundamental problem is the metals that fill a via or other metal structures in/on a substrate. Planarizing generally uses a form of chemical mechanical polishing (CMP) of the substrate and structure on/in the substrate to bring the surface to be flat and parallel. The challenge is that the substrates are quite hard relative to the other material on or in the substrate. As an example, boron silicate quartz and silicon have a hardness between 6 to 7 Mohs while typical metals (copper, gold and silver) used in high frequency application have a hardness of 2.5 to 3 Mohs. This hardness differential creates a fundamental problem when using CMP to planarize the surface. The softer metal structures are removed at a higher rate than the harder substrate. This creates a lower surface in the metal structure relative to the surface of the harder substrate. The transition from substrate to metal structure can be as great as 0.5 µm. In general, the magnitude of the depth of this transition is not uniform across a wafer. This transition or step creates a random thinning of structures/devices that are made on top of, or that cross the substrate metal transition.

At low frequencies, that solution is to simply create the device in the planar field of the substrate and run a metal interconnected to the metal structure such as a via or imbedded metal structure. Unfortunately, at RF, millimeter, and microwave frequencies this metal run creates to a via or imbedded metal structure, which creates additional inductive parasitic inductance and damages the performance of the circuit. Moving the device over the physical transition means that the device will have a random thickness variation, often referred to as necking of passive devices thickness as the device transitions from the substrate to the via or imbedded metal structure. One example of this is the creation of a capacitor where the metal electrodes and dielectric layer are thinner over the substrate metal transition. Variations in the thickness results in random capacitors across the die/substrate, creating random capacitance and filters RF, millimeter, and microwave circuits making the circuit/device. Placing a filter, capacitor, other passive device or/and active device adjacent and greater than 250 µm from the via induces parasitic inductance from the metal trace between the passive device and the via/imbedded metal structure.

The passive device can be placed in conjunction with active devices and can be combined to make a wide array of RF systems and subsystems including: antennas with gain, RF Circulators, RF Isolators, RF Combiners, RF Couplers, RF Splitters, Transformers, Switches, Multiplexors, Duplexers, and/or Diplexers that are connected by via as well as metal lines and via to each other and ground planes.

Constructing passive devices as close as possible to the via that shunts parasitic and electrical noise to a ground plane dramatically improves performance and reduces the die size for RF, microwave, and millimeter electronic systems. This invention provides a general solution to the constructing passive device in intimate proximity to metalized via or buried structure eliminating connecting to a ground plane and eliminating the random device performance and parasitic across the device substrate metal transition.

BRIEF DESCRIPTION OF THE DRAWINGS

For a more complete understanding of the features and advantages of the present invention, reference is now made to the detailed description of the invention along with the accompanying figures and in which:

FIGS. 4A and 4B show cross-sectional side views of two of the steps of the method. FIGS. 4C to 4F show the remained of the steps for making the annular capacitor RF, microwave and millimeter (MM) wave systems of the present invention.

DETAILED DESCRIPTION OF THE INVENTION

While the production and use of various embodiments of the present invention are discussed in detail below, it should be appreciated that the present invention provides many applicable, inventive concepts that can be embodied in a wide variety of specific contexts. The specific embodiments discussed herein are merely illustrative of specific ways to make and use the invention and do not delimit the scope of the invention. To facilitate the understanding of this invention, a number of terms are defined below. Terms defined herein have meanings as commonly understood by a person of ordinary skill in the areas relevant to the present invention.

In one embodiment, the present invention includes a method for creating a substrate, an annular capacitor structure where the adjacent edge of the capacitive structure less than 250 μm of the via or imbedded metal structure in the substrate eliminates or minimizes the inductance associated with the metal line.

Figure 1:
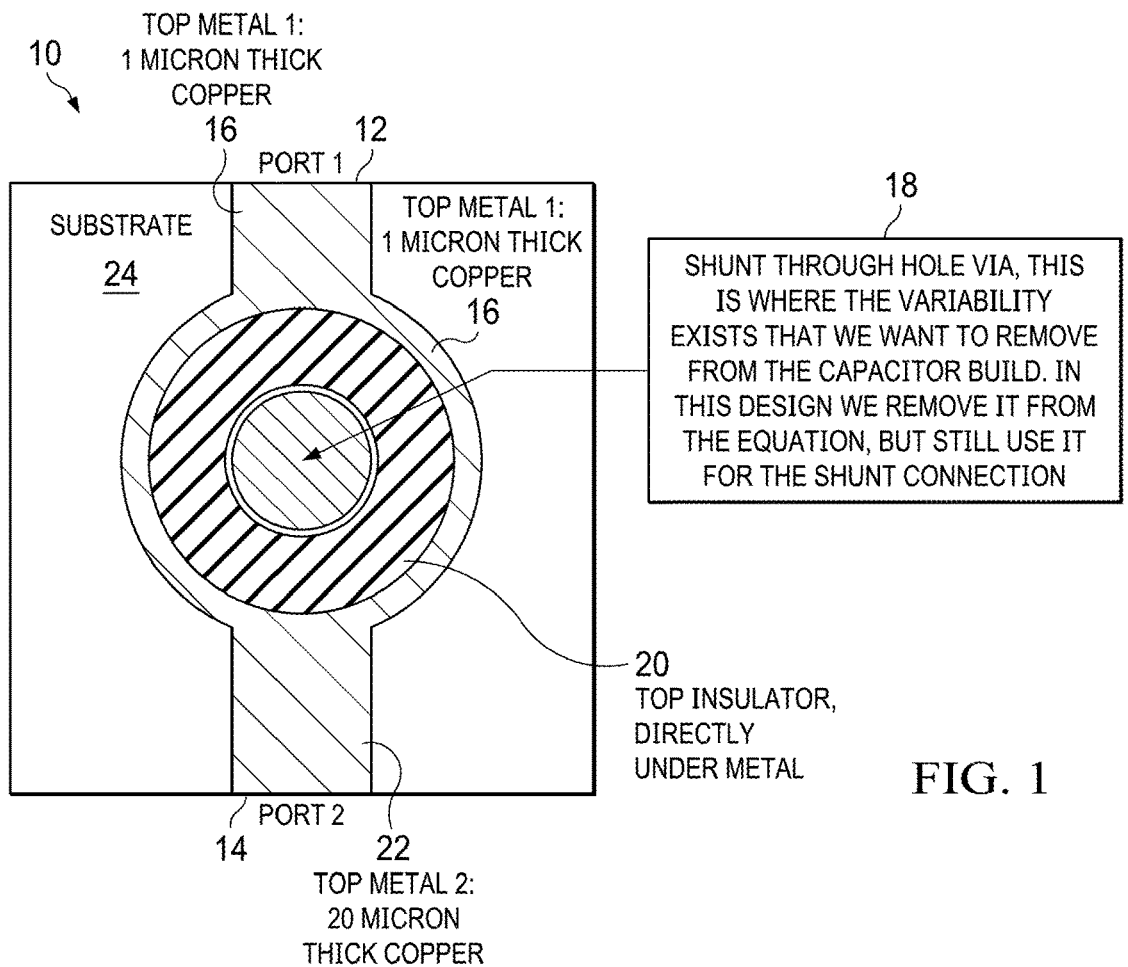
FIG. 1 shows a schematic of an annular RF shunt capacitor.

FIG. 1 shows an example of the device 10, that includes ports 12 and 14 that connect to a top metal 16, which can be a copper layer that is connected to, or shunted, to a through-via hole 18. The design of the present invention reduces the variability from the capacitor build.

In this design, the through-via hole is formed but does not affect the capacitor, thus eliminating that variable from design consideration(s). A top insulator 20 is positioned between the top metal 16 and the via 18, and a second metal layer 22 is deposited on the insulator 20. The structure is formed in a substrate 24.

Figure 2:
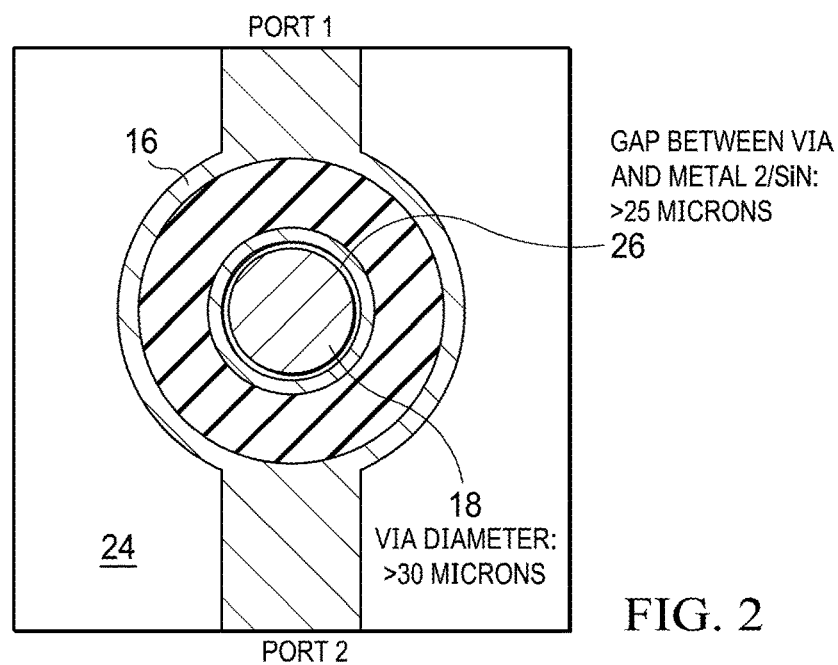
FIG. 2 shows a schematic of an annular RF shunt capacitor with dimensional information between the adjacent annular element and the via.

FIG. 2 shows an internal view of the device 10, that shows the gap 26, between the through-hole via 18 and the first metal layer 16. Ports 12 and 14 that connect to a top metal 16, which can be a copper layer that connected to, or shunted, to a through-via hole 18.

Figure 3:
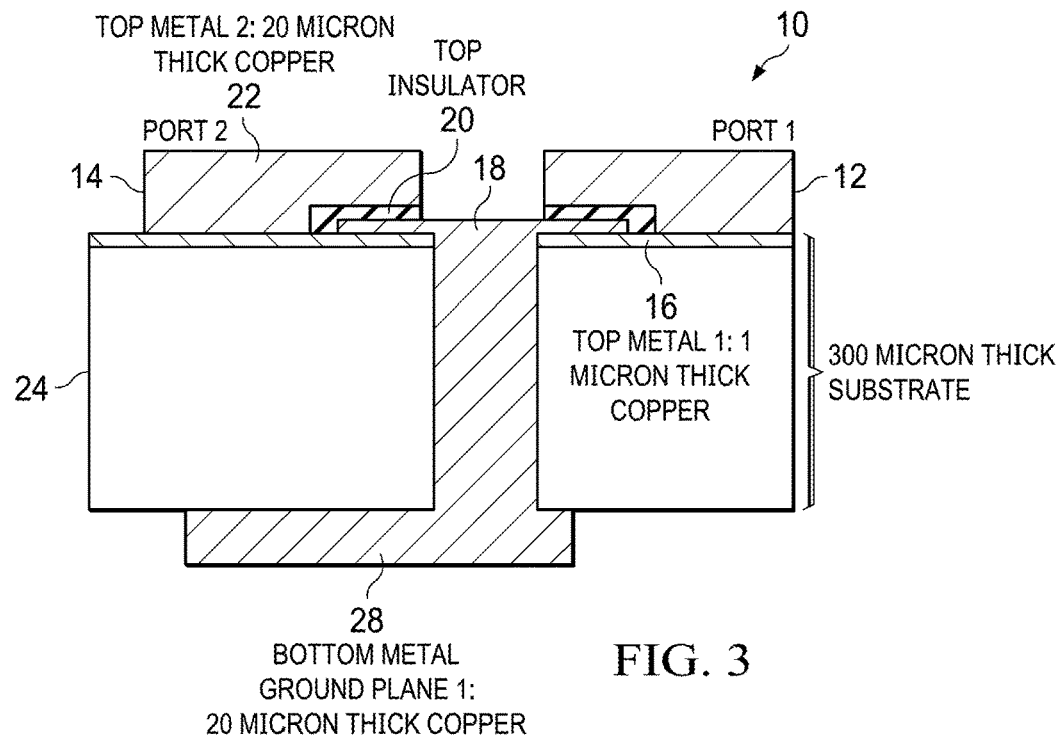
FIG. 3 shows a schematic of a cross section for annular RF shunt capacitor.

FIG. 3 is a cross-section side view of the device 10. Ports 12 and 14 are shown in this configuration as being on opposite sides of the through-hole via 18, which is isolated from the top metal layer 16 and the second top metal layer 22, by insulator 20. A bottom metal ground plane 28 is depicted connected to through-hole via 18.

FIGS. 4A to 4F and 5 show a step-by-step method of making the device 10 of the present invention. The process flow to create a planarized surface in a substrate with dissimilar materials to eliminate vertical transitions from a substrate to an added material is as follows:

Step 1. Lap and polish a substrate with the metal structures.

Figure 4A:
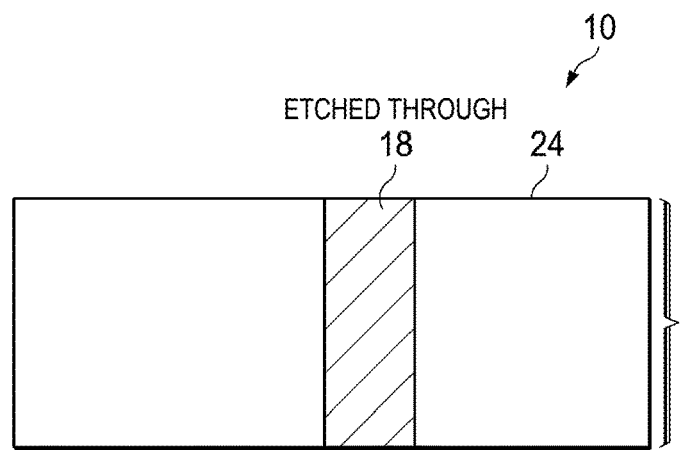
FIGS. 4A to 4F show a step-by-step method of making the device of the present invention.
Figure 4B:
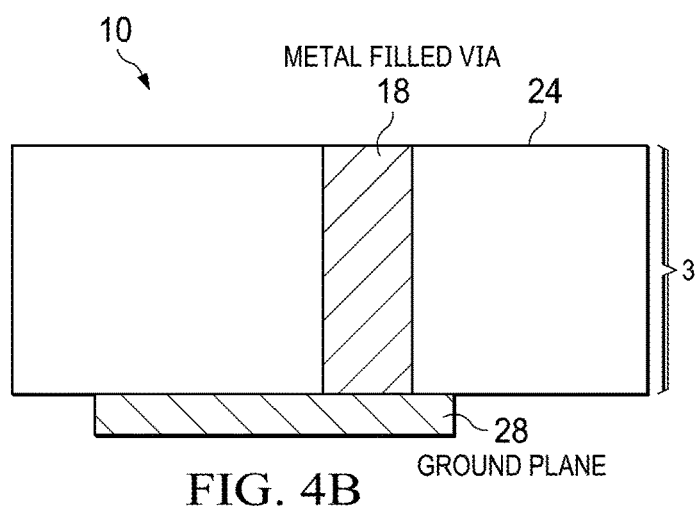

Step 2. Machine or etch a via or trench in the substrate, as shown in FIG. 4A as a cross-sectional side view that includes the substrate 24 into which the trench or via 18 is cut or etched.

Step 3. Fill the via, ground plane or trench with copper using any of a number of processes including chemical vapor deposition (CVD), silkscreen, atomic layer deposition (ALD) or other, as shown in cross-sectional side view in FIG. 4B that shows the substrate 24 into which the trench or via 18 is cut or etched, and the metal filled through-hole via 18 and a ground plane 28. One example is to selectively deposit tantalum on the sidewalls of the via or trench structures and then deposit copper organometallic by a silkscreen deposit. The filled substrate is then heated in argon to drive off/decompose the organic material and densify the copper. For the copper deposited, the adhesion layer is a few hundred angstroms of tantalum. The adhesion layer may be removed over the metal. The thickness of the metal/non substrate material needs to be between two times and ten times the transition step. The thickness of the deposited material can be measured in real time using a variety of techniques including, e.g., a crystal oscillator during a vacuum deposition processes, where one side of the via is connected to a ground plane.

Step 4. Coat the front side of the substrate with a photoresist and expose and develop an annular shape that circumscribes the via.

Figure 4C:
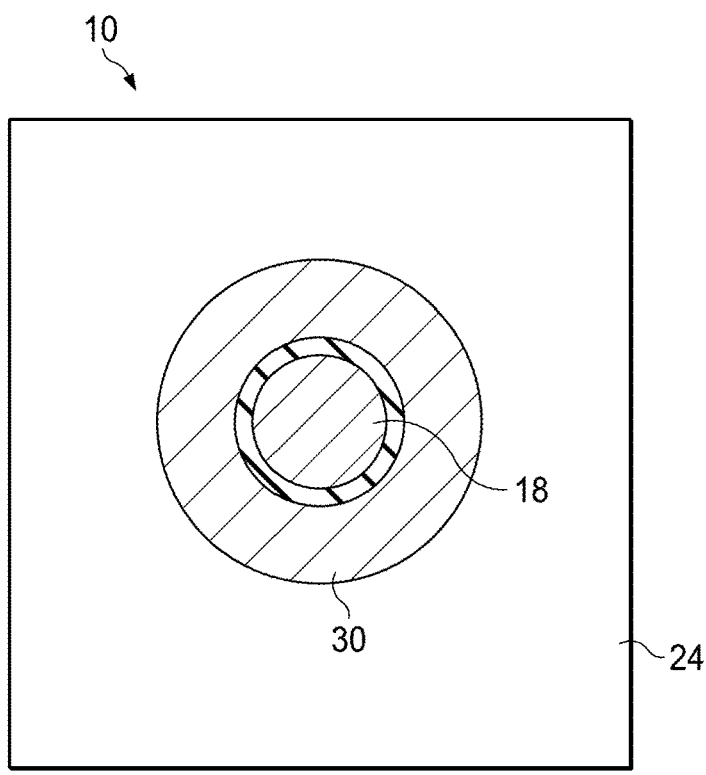

Step 5. Using a DC sputtering system, coat the photoresist with a copper adhesion layer of a few hundred angstroms of tantalum. Coat the substrate with 2 μm of copper to form the bottom electrode, as shown in FIG. 4C, which is a top-view of the device 10. The substrate 24 is shown with through-hole via 18, on which a bottom metal annular patter 30 is shown.

Step 6. Remove the photoresist to form a bottom electrode connected to the via.

Step 7. Coat the front side of the substrate with a photoresist and expose and develop an annular shape that circumscribes the via, where the inner radii is between 2 μm and 300 μm from the outer edge of the metal filled via and external radii of the pattern is between 10 μm and 500 μm respectively.

Figure 4D:
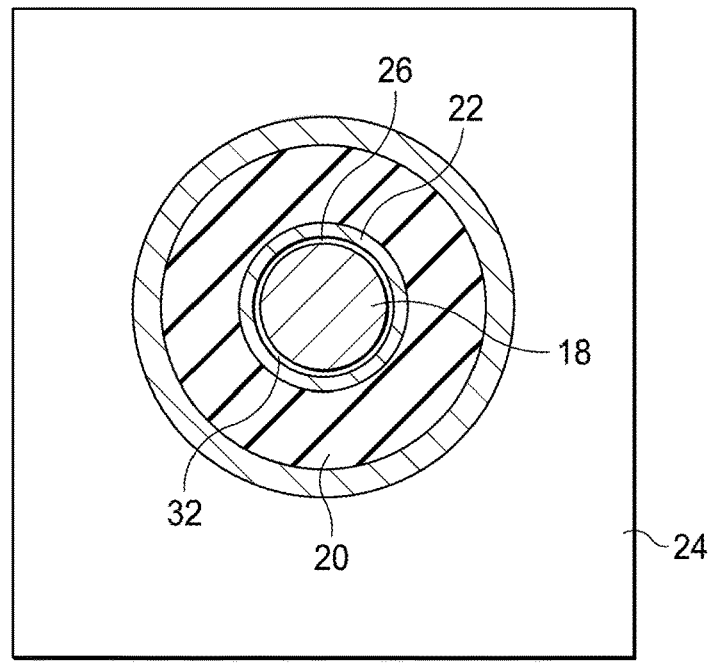

Step 8. Using ALD or other deposition, deposit between 0.1 μm and 10 μm of a dielectric material, where the dielectric material has a dielectric constant between 2 and 2,000, as shown in FIG. 4D, which is a top view of the device 10. The substrate 24 is shown in which a gap 32 is depicted between the through-hole via 18 and the second metal layer 22. Also depicted is the insulator 20 (also referred to as a dielectric material).

Step 9. Remove the photoresist to form a dielectric region that is at least 1 μm larger than the bottom electrode.

Step 10. Coat the front side of the substrate with a photoresist and expose and develop an annular shape that is at least 2 μm greater than the dielectric layer and where one side transitions to other active or passive devices in the circuit.

Step 11. Using a DC sputtering system, coat the photoresist with a copper adhesion layer is a few hundred angstroms of tantalum. Coat the substrate with 2 μm of copper to form the top electrode.

Figure 4E:
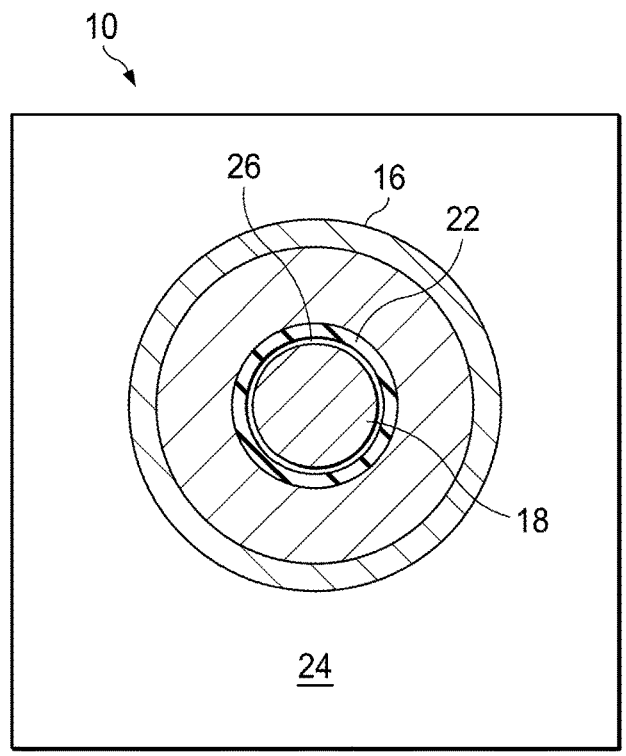

Step 12. Remove the photoresist to form a top electrode for the capacitor structure, which is depicted in FIG. 4E, which shows the device 10, that now includes top metal layer 22, disposed on the insulator 20, and includes the gap 26, the bottom metal layer 16, the through-hole via 18, and the first metal layer 16.

Step 13. Coat the front side of the substrate with a photoresist and expose and develop a connecting metal line to both sides of the bottom metal of the annular structure.

Figure 4F:
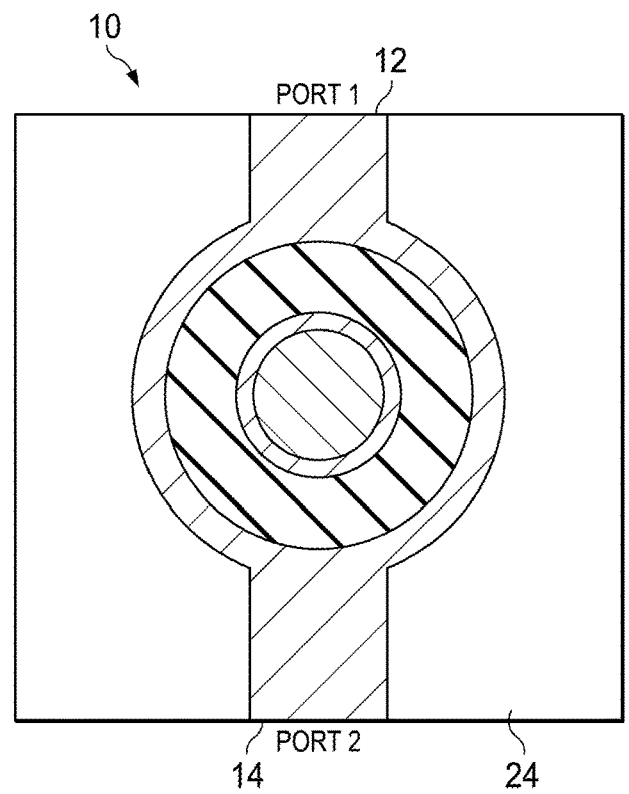
Figure 5:
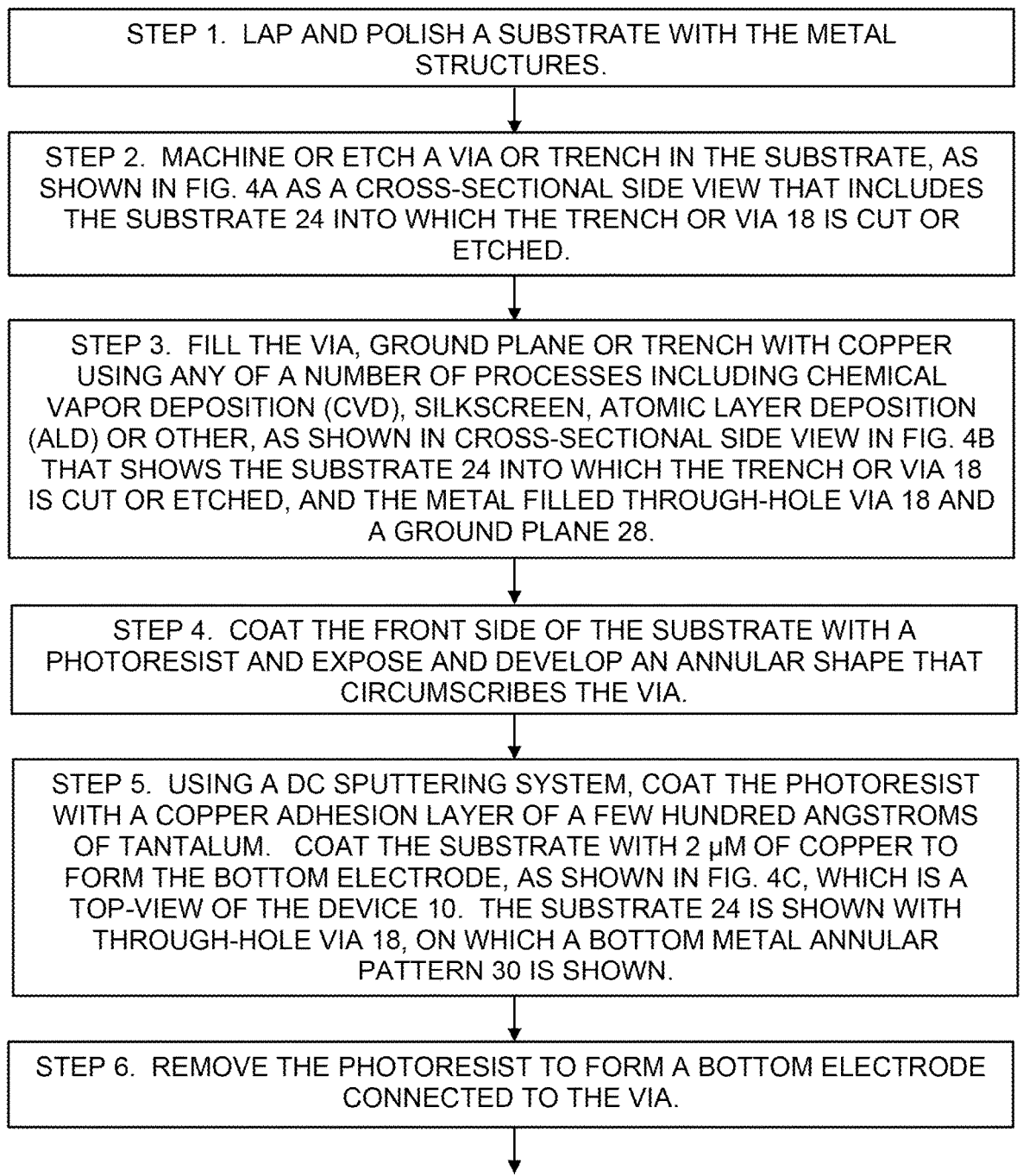
FIG. 5 shows a process flow to create a planarized surface in a substrate with dissimilar materials to eliminate vertical transitions from a substrate to an added material.
Figure 5:
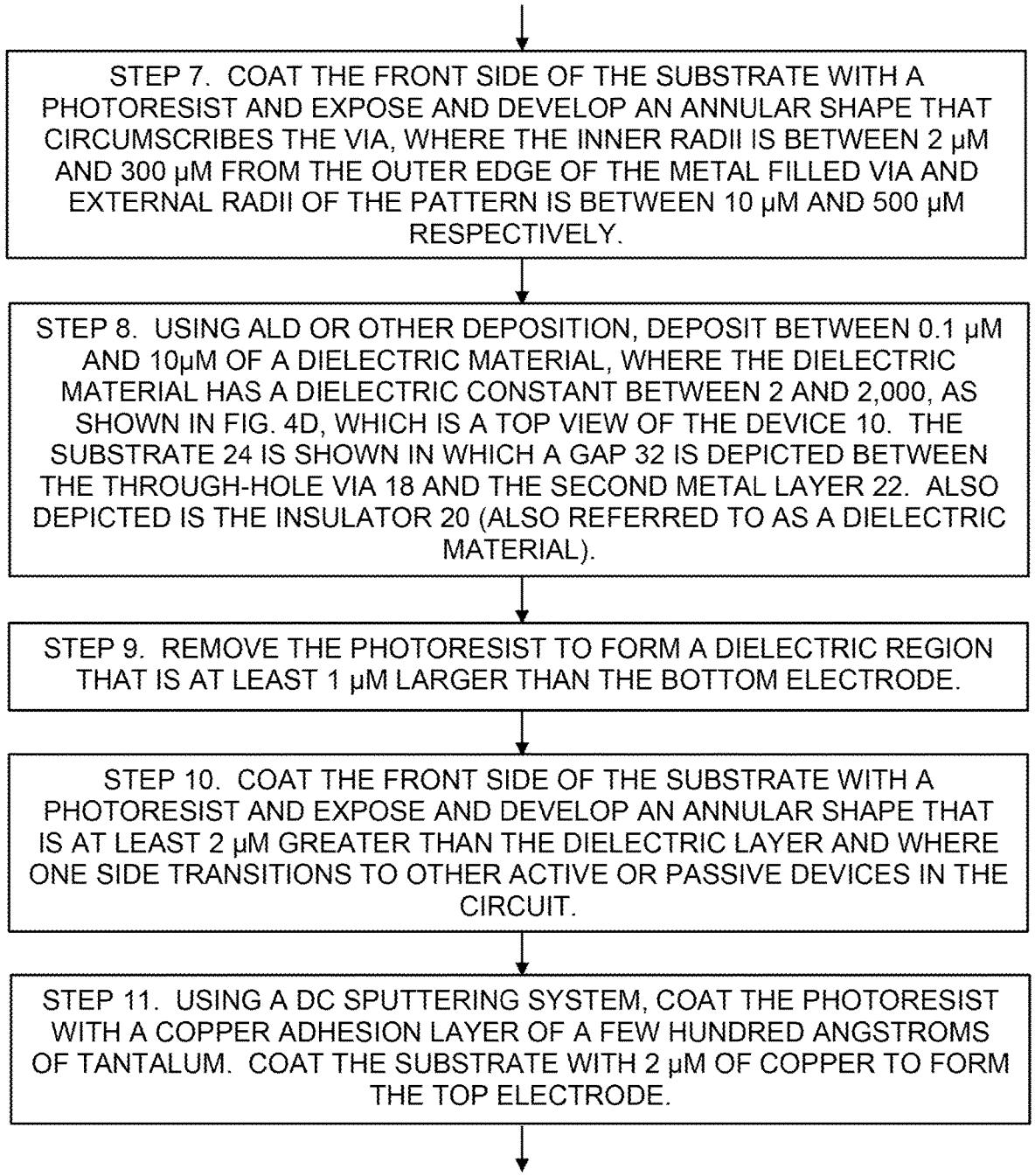

Step 14. Using a DC sputtering system, coat the photoresist with a copper adhesion layer is a few hundred angstroms of tantalum. Coat the substrate with 2 μm of copper to form the top electrode. FIG. 4F shows the device 10, which now includes all the layers and ports 12 and 14.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of". As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step or a limitation) or group of integers (e.g., feature(s), element(s), characteristic(s), property(ies), method/process steps or limitation(s)) only.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

As used herein, words of approximation such as, without limitation, "about", "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skilled in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

What is claimed is:

1. A method for creating a capacitor for a radio frequency (RF) millimeter, or microwave device that at least partially circumscribes a metal-filled via-based or trench-based transmission line that connects a passive device or an active device and one or more ground planes, the method comprising:
   cutting a trench or via in a first surface of a substrate;
   filling the trench or via with a first metal filling;
   forming a ground plane on a second surface of the substrate opposite the first surface;
   coating, exposing, and developing photoresist into a first annular shape that circumscribes the trench or via on the first surface of the substrate;
   depositing a first metal layer on the first surface of the substrate;
   coating, exposing, and developing photoresist into a second annular shape that circumscribes the trench or via on the first surface of the substrate, where an inner radius of the second annular shape is between 2 μm and 300 μm from an outer edge of the via or trench, and an external radius of the second annular shape is between 10 μm and 500 μm;
   depositing a dielectric material on the first surface of the substrate to form a dielectric layer;
   coating, exposing, and developing photoresist into a third annular shape on the first surface of the substrate, wherein the third annular shape is at least 2 μm greater than the dielectric layer and wherein at least a portion of the third annular shape transitions to one or more active or passive devices of a circuit;
   depositing a second metal layer on the first surface of the substrate;
   coating, exposing, and developing photoresist to connect the second metal layer between the first and second surfaces of the substrate; and
   depositing a metal to connect the first metal layer and the ground plane to form an electrode on the first surface of the substrate.

2. The method of claim 1, further comprising producing a transition of less than 0.1 μm.

3. The method of claim 1, further comprising depositing an adhesion layer between at least one of a side or bottom on the trench or via prior to filling the trench or via with the first metal filling. depositing the first metal layer.

4. The method of claim 1, further comprising depositing an adhesion layer prior to depositing the second metal layer.

5. The method of claim 1, wherein the first metal filling, the first metal layer, or the second metal layer is copper, silver, gold, aluminum, or a metal alloy.

6. The method of claim 1, wherein the one or more active or passive devices are at least one of: RF Filters, RF Circulators, RF Isolators, Antenna, Impedance Matching Elements, 50 Ohm Termination Elements, Integrated Ground Planes, RF Shielding Elements, EMI Shielding Elements, RF Combiners, RF Splitters, Transformers, Switches, power splitters, power combiners, Duplexer, or Diplexers on the first surface of the substrate and connectable to one or more input or output input/output ports.

7. The method of claim 6, wherein the device is a RF Circuit that eliminates at least 95% of the RF parasitic signal associated with a device-substrate transition.

8. The method of claim 6, wherein the device is a RF Circuit that eliminates at least 85% of the RF parasitic signal associated with a device-substrate transition.

9. The method of claim 6, wherein the device is a RF Circuit that eliminates at least 75% of the RF parasitic signal associated with a device-substrate transition.

10. The method of claim 1, wherein the substrate or the dielectric is a photodefinable glass.

11. The method of claim 1, wherein the electrode comprises a first and a second port.

12. An electrode comprising a capacitor for a RF, millimeter, or microwave device that at least partially circumscribes a metal-filled via-based or trench-based transmission line that connects a passive device or an active device and one or more ground planes, wherein the electrode is made by a method comprising:
    cutting a trench or via in a first surface of a substrate;
    filling the trench or via with a first metal filling;
    forming a ground plane on a second surface of the substrate opposite the first surface;
    coating, exposing, and developing photoresist into a first annular shape that circumscribes the trench or via on the first surface of the substrate;
    depositing a first metal layer on the first surface of the substrate;
    coating, exposing, and developing photoresist into a second annular shape that circumscribes the trench or via on the first surface of the substrate, where an inner radius of the second annular shape is between 2 µm and 300 µm from an outer edge of the via or trench, and an external radius of the second annular shape is between 10 µm and 500 µm;
    depositing a dielectric material on the first surface of the substrate to form a dielectric layer;
    coating, exposing, and developing photoresist into a third annular shape on the first surface of the substrate, wherein the third annular shape is at least 2 µm greater than the dielectric layer and wherein at least a portion of the third annular shape transitions to one or more active or passive devices of a circuit;
    depositing a second metal layer on the first surface of the substrate;
    coating, exposing, and developing photoresist to connect the second metal layer between the first and second surfaces of the substrate; and
    depositing a metal to connect the first metal layer and the ground plane to form the electrode on the first surface of the substrate.

13. The electrode of claim 12, further comprising producing a transition of less than 0.1 µm.

14. The electrode of claim 12, further comprising depositing an adhesion layer between at least one of a side or bottom on the trench or via in the substrate prior to filling the trench or via with the first metal filling.

15. The electrode of claim 12, further comprising depositing an adhesion layer prior to depositing the second metal layer.

16. The electrode of claim 12, wherein the first metal filling, the first metal layer, or the second metal layer is copper, silver, gold, aluminum, or a metal alloy.

17. The electrode of claim 12, wherein the one or more active or passive devices are at least one of: RF Filters, RF Circulators, RF Isolators, Antenna, Impedance Matching Elements, 50 Ohm Termination Elements, Integrated Ground Planes, RF Shielding Elements, EMI Shielding Elements, RF Combiners, RF Splitters, Transformers, Switches, power splitters, power combiners, Duplexer, or Diplexers on the first surface of the substrate and connectable to one or more input or output ports.

18. The electrode of claim 17, wherein the device is a RF Circuit that eliminates at least 95% of the RF parasitic signal associated with a device-substrate transition.

19. The electrode of claim 17, wherein the device is a RF circuit that eliminates at least 85% of the RF parasitic signal associated with a device-substrate transition.

20. The electrode of claim 17, wherein the device is a RF circuit that eliminates at least 75% of the RF parasitic signal associated with a device-substrate transition.

21. The electrode of claim 12, wherein the substrate or the dielectric is a photodefinable glass.

22. The electrode of claim 12, wherein the electrode comprises a first and a second port.

* * * * *